United States Patent [19]
Vasquez

[11] Patent Number: 5,940,686
[45] Date of Patent: Aug. 17, 1999

[54] METHOD FOR MANUFACTURING MULTI-CHIP MODULES UTILIZING DIRECT LEAD ATTACH

[75] Inventor: Armando C. Vasquez, Laguna Niguel, Calif.

[73] Assignee: Conexant Systems, Inc., Newport Beach, Calif.

[21] Appl. No.: 08/629,926

[22] Filed: Apr. 12, 1996

[51] Int. Cl.$^6$ .................................................. H01L 21/44
[52] U.S. Cl. ........................................... 438/107; 438/108
[58] Field of Search ..................... 438/107, 108, 438/111, 123; 361/774

[56] References Cited

U.S. PATENT DOCUMENTS

| | | | |
|---|---|---|---|
| 3,793,714 | 2/1974 | Bylander | 29/583 |
| 4,820,658 | 4/1989 | Gilder, Jr. et al. | 438/111 |
| 4,948,375 | 8/1990 | Lawrence et al. | 361/774 |
| 4,967,042 | 10/1990 | Shephard et al. | 361/774 |
| 5,012,386 | 4/1991 | McShane et al. | 361/774 |
| 5,169,805 | 12/1992 | Mok et al. | 438/107 |
| 5,177,032 | 1/1993 | Fogal et al. | 438/123 |
| 5,274,197 | 12/1993 | Kondo et al. | 174/267 |
| 5,299,097 | 3/1994 | Kondo et al. | 361/774 |
| 5,394,298 | 2/1995 | Sagisaka | 361/704 |
| 5,438,021 | 8/1995 | Tagawa et al. | 438/107 |
| 5,661,337 | 8/1997 | Manteghi | 361/774 |
| 5,686,698 | 11/1997 | Mahadevan et al. | 361/774 |
| 5,770,479 | 6/1998 | Brooks et al. | 438/111 |
| 5,776,802 | 7/1998 | Ochi et al. | 438/123 |

FOREIGN PATENT DOCUMENTS

| | | |
|---|---|---|
| 0554893A2 | 2/1993 | European Pat. Off. . |
| 05067814A1 | 4/1993 | European Pat. Off. . |
| 0620591A1 | 3/1994 | European Pat. Off. . |

*Primary Examiner*—Kevin M. Picardat
*Attorney, Agent, or Firm*—Snell & Wilmer; Philip K. Yu

[57] ABSTRACT

A multi-chip module made by using a direct attach method for manufacturing a multi-chip module by manufacturing a plurality of chips using a direct attach method and encapsulating the multi-chip models. The direct-attach method of manufacturing includes providing a special-design printed circuit board, manufacturing a lead frame with special design features including a central cavity for accommodating the specially designed printed circuit board and chips, assembling the lead frame and the printed circuit board using a conductive epoxy and curing the lead frame and printed circuit board assembly. The special-design printed circuit board includes a plurality of locating holes used for aligning the lead frame with the printed circuit board, a plurality of peripheral holes adapted to receive a corresponding lead frame finger, non-pointed corners, a silver or gold final plurality and a dry film.

7 Claims, 9 Drawing Sheets

METHOD FOR MANUFACTURING MULTI-CHIP MODULES UTILIZING DIRECT LEAD ATTACH

BACKGROUND OF THE INVENTION

This invention relates to the manufacture of multi-chip modules and, in particular, to a method for making a multi-chip module by manufacturing a plurality of chips using a direct attach method and encapsulating the multi-chip module.

Semiconductor devices, colloquially referred to as chips, are used in the manufacture and operation of many electronic devices which have become an integral part of everyday life. Manufacturers of electronic devices are forced to make products having increased functionality and better quality. This often means having to put more chips in a given work area (i.e., increasing chip density).

One way of satisfying this need for increased chip density is to use multi-chip modules. Today's methods for making multi-chip modules, however, are often time-consuming and costly and result in low assembly yields. Two basic components employed in existing methods of multi-chip module manufacture are a printed circuit board and a lead frame. During the manufacturing process, the printed circuit board must be, in some fashion, conductively connected to the lead frame such that, when necessary, any component on the printed circuit board may have a conductive path on which to receive sufficient electrical voltage to operate properly.

Today, two well-known methods are used for effecting this conductive connection between a printed circuit board and a lead frame. As shown in FIG. 1A, the first of these involves the use of wire attachments 100 to create a connection between a printed circuit board 105 and a lead frame 110. In this method, a conventional printed circuit board and a conventional lead frame are used. During assembly, the printed circuit board 105 is fixedly mounted on top of the lead frame's central platform 115. Subsequently, in a similar manner to that used in the well-known wire bonding procedure for chip manufacture, a thin wire is first bonded to a printed circuit board bonding pad or hole and spanned to a lead frame finger. Next, the wire is bonded to the lead frame finger. Last, the wire is clipped and the entire process repeated at the next printed circuit board bonding pad or hole. Additionally, to provide a conductive pathway between a lead-frame finger and a particular component, a bonding wire extends from the particular component and the bonding pad. Again, this component/bonding pad connection is created using the well-known wire bonding procedure discussed above. While this may be a conceptually simple process, it is nonetheless critical because the wires must be accurately placed, every wire must establish good electrical contact at both ends, and the span between the printed circuit board's bonding pad or hole and the lead frame finger must have a kink-free arc positioned at a safe distance from surrounding wires. Wire bonding is done with either gold or aluminum wires. Both of these materials are highly conductive and sufficiently ductile to withstand deformation during the bonding process and yet remain strong and reliable.

Today, use of the most commonly used of these bonding materials is gold. Gold is the best-known room-temperature conductor, an excellent heat conductor, and resistant to oxidation and corrosion. Thus, gold can be melted to form a strong bond with the printed circuit board bonding pads or holes without oxidizing during the process.

There are a number of drawbacks to using bonding wires to attach a printed circuit board to a lead frame. For example, the high cost of gold makes its use as bonding wire material expensive. Bonding wire breakage during encapsulation results in reduced assembly yields, an undesirable condition to most manufacturers. Gold is susceptible to induction, and induction causes circuit noise. Circuit noise, in turn, may cause a module to operate improperly or unpredictably or to not operate at all. The use of bonding wires prohibits the mounting of chips on both sides of the printed circuit board thereby limiting the surface area available for chip placement. As the area available for chip placement on a given module decreases, so does the ability to meet customer-demanded increases in functionality without expanding work areas. The use of bonding wires requires extremely accurate wire placement; such accuracy demands time thereby slowing down the assembly process.

Figures 1, 1C:
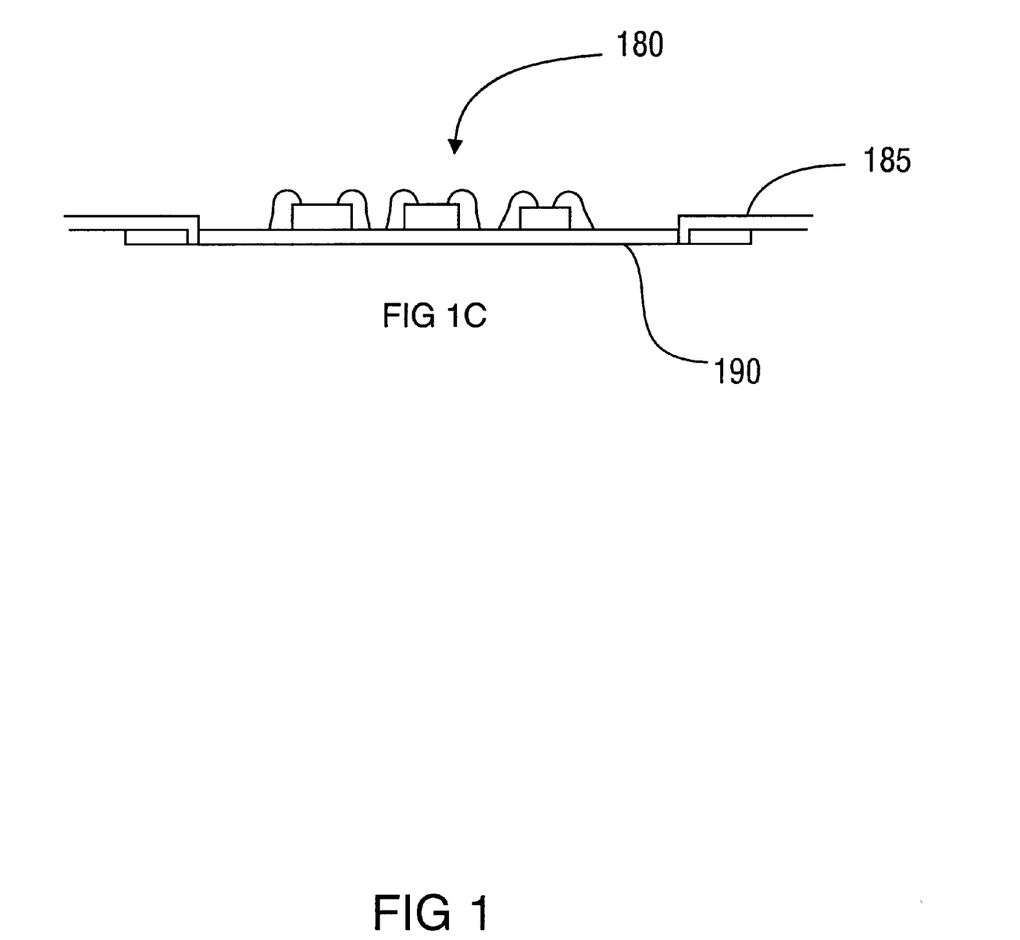
Figure 1A:
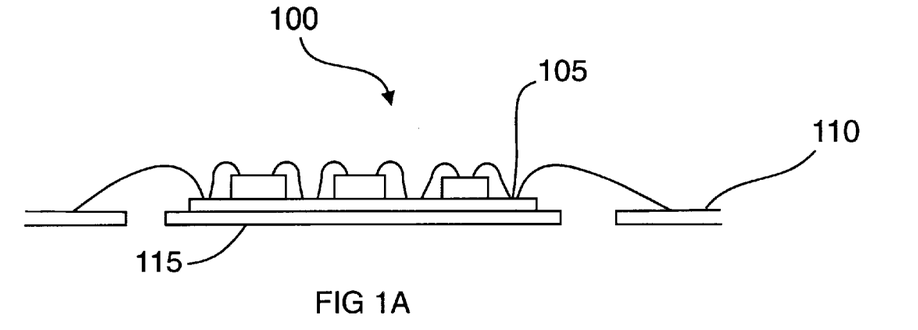
Figure 1B:
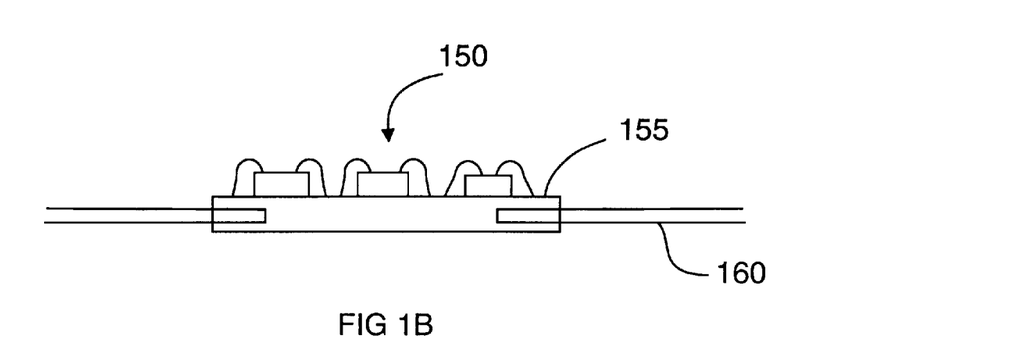

The second of the two well-known methods for conductively connecting a printed circuit board that provides conductive paths between lead frame fingers and components involves the use of a laminated printed circuit board 150 and is illustrated in FIG. 1B. A printed circuit board 155 is made using multiple layers that are laminated to form one structure. During the printed circuit board's lamination process, lead frame fingers are inserted into the printed circuit board 150 such that a portion of each lead frame finger is fixed within the layers of laminate. The other portion of each lead frame finger protrudes beyond the perimeter of the printed circuit board. As such, the result is a single laminated printed circuit board unit 150 including a printed circuit board 155 and a lead frame 160.

This method also has a number of drawbacks. For example, this method is time-consuming in that the printed circuit board's manufacturing process requires an added step—insertion of the lead frame fingers into the printed circuit board. The manufacturing process is also lengthened because additional precautionary measures must be taken to prevent damage to the lead frame fingers during manufacture of the printed circuit board.

Multi-chip modules employing a laminated printed circuit board wherein lead frame fingers become part of the printed circuit board during lamination are also known in the art.

I. SUMMARY OF THE INVENTION

This invention features a multi-chip module made by using a direct attach method for manufacturing a multi-chip module by manufacturing a plurality of chips using a direct attach method and, then, encapsulating the multi-chip module. The method includes the steps of manufacturing a lead frame with special design features, providing a specially-designed printed circuit board, assembling the printed circuit board and lead frame into a board-frame-epoxy module utilizing a conductive epoxy and curing the board-frame-epoxy module.

II. BRIEF DESCRIPTION OF THE DRAWINGS

FIG. 1 A is a schematic side view representation of a module that employs wire bonds. FIG. 1 B is a schematic side view representation of a module that employs a laminated lead frame. FIG. 1 C is a schematic side view representation of a module configured in accordance with the present invention.

III. DETAILED DESCRIPTION OF SPECIFIC EMBODIMENTS

Manufacturing a multi-chip module using the direct attach method of this invention is similar to framing a picture. First, a frame is made leaving a central cavity wherein a picture may be placed and directly attached to the frame.

FIG. 1C shows an example of the present invention, the frame is a lead frame 185 having special design features as described below and the artwork is a printed circuit board 190 specially designed as described below. As shown in the following paragraphs, once made, the lead frame 185 and the printed circuit board 190 are assembled to form a single multi-chip module 180 much like a picture is assembled with a frame to form a framed picture.

Figure 2:
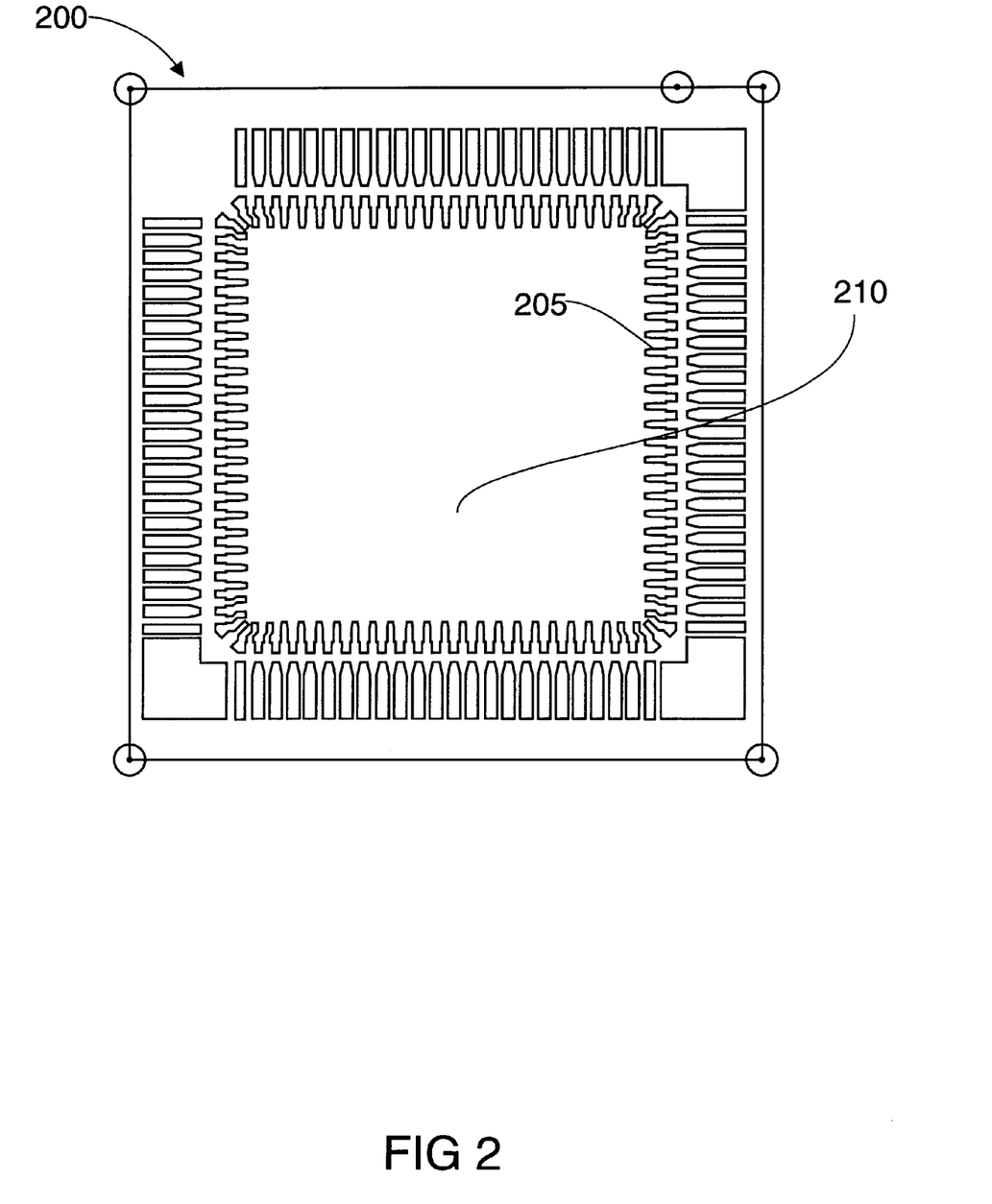
FIG. 2 is a block diagram overview of a lead frame having a central cavity and lead frame fingers.

In accordance with the present invention, a lead frame with special design features 200, FIG. 2, may be manufactured. The lead frame 200 may be designed to accommodate semiconductor chips. Additionally, the lead frame 200 may be designed to fit the specially designed printed circuit board (discussed below) in either a single-chip or multi-chip assembly.

Figure 3:
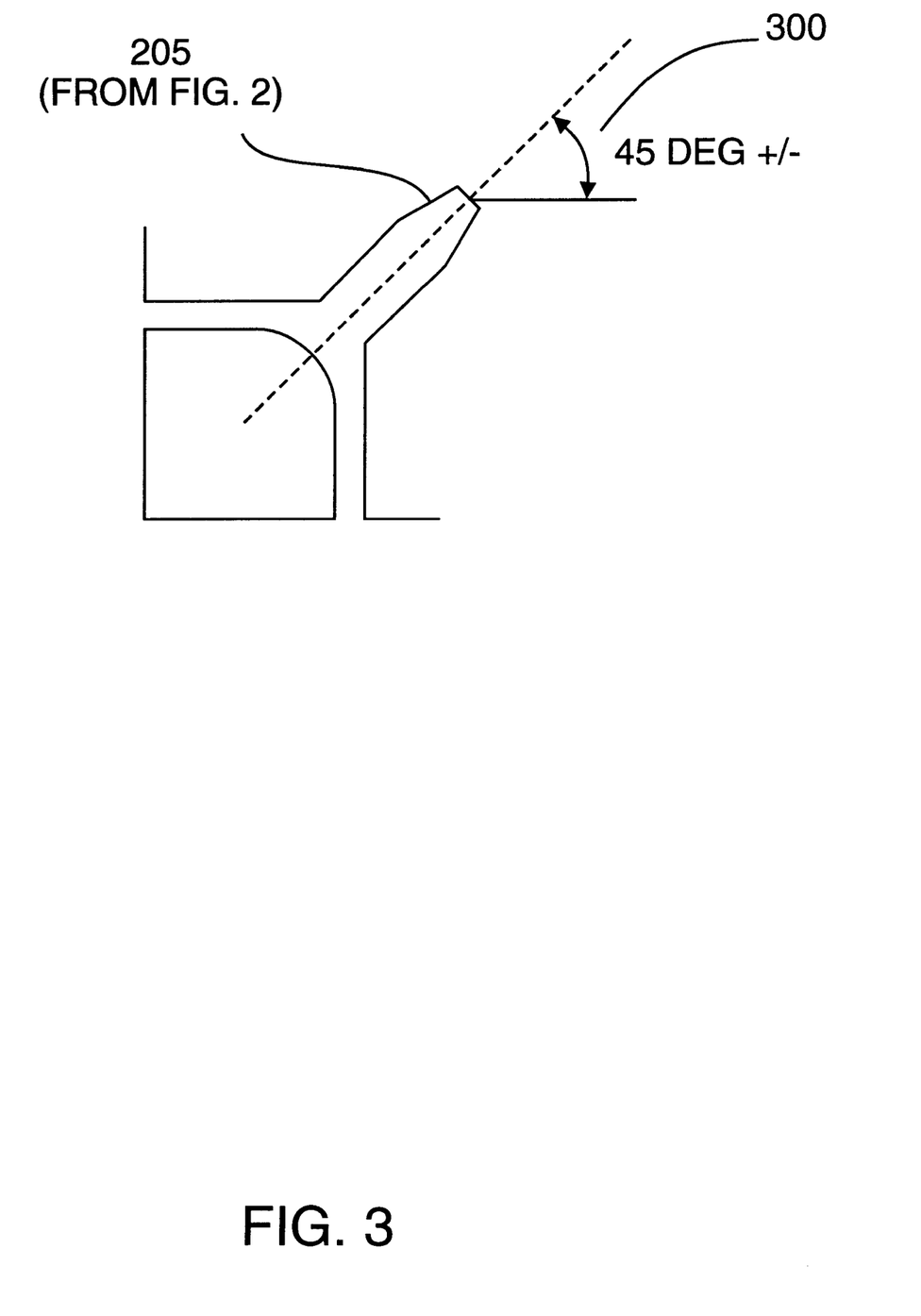
FIG. 3 is a schematic representation of a tapered lead frame finger.

As shown in FIG. 2, the lead frame 200 of the present invention includes a plurality of lead frame fingers 205 and a central cavity 210. The lead frame fingers 205 may conductively connect the lead frame 200 to a printed circuit board. In accordance with the present invention, each of the lead frame fingers 205 is tapered. Such tapering facilitates assembly; a tapered lead frame finger is easier to insert into a printed circuit board's peripheral holes, described below. As shown in FIG. 3, the taper angle 300 of each lead frame finger 205 should be the same on both sides of the lead frame finger. A 45 degree taper has been found to work satisfactorily.

Each lead frame finger 205 may be plated with gold or silver for improved bonding characteristics during an epoxy curing phase of assembling the lead frame to a printed circuit board as discussed below; plating also helps prevent oxidation or corrosion, especially if copper is used for the lead frame material. Such plating may be accomplished in any convenient manner as well known to those of ordinary skill.

The central cavity 210 may be formed by removing material from the center of the lead frame 200 (e.g., by cutting or etching), or alternatively by manufacturing the lead frame without a central pad, thereby creating a cavity where a printed circuit board may be seated. Manufacturing of a lead frame without a central cavity is done in any convenient manner as well known to those of ordinary skill in the art.

Figure 4:
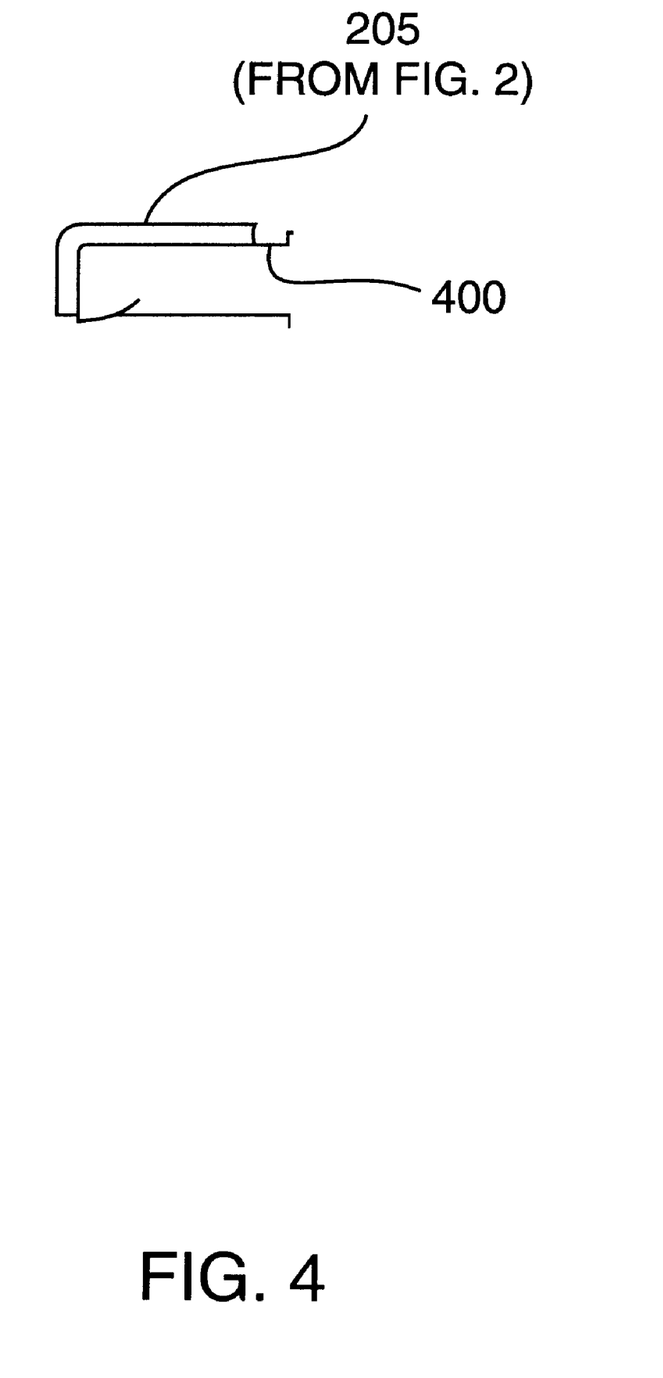
FIG. 4 is a schematic representation of a bent lead frame finger.

As illustrated in FIG. 4, each tapered lead frame finger 205 may be bent with respect to the plane of the lead frame 400. A 90 degree bend has been found to work satisfactorily.

Figure 5:
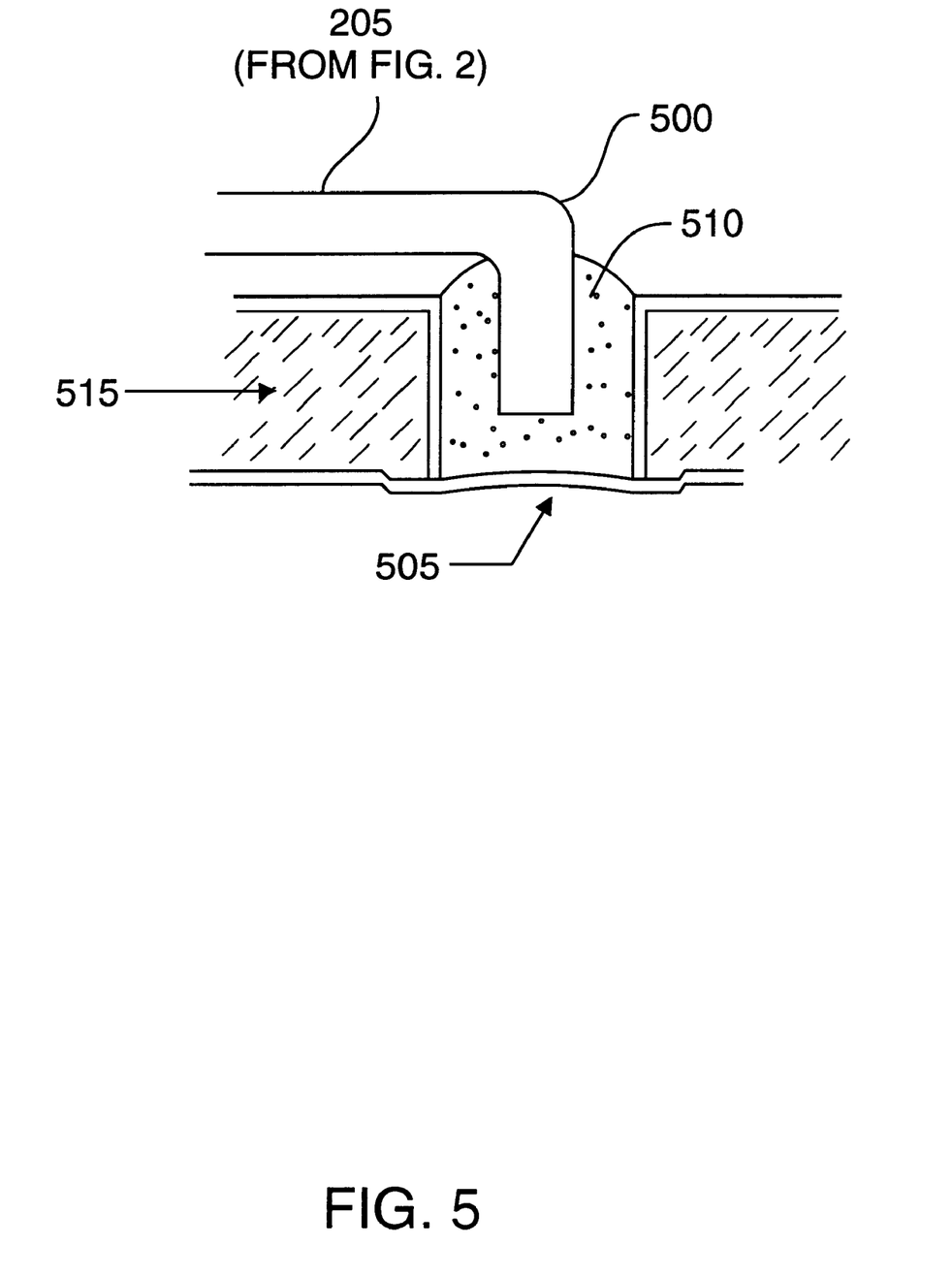
FIG. 5 is a block diagram showing a bent lead frame inserted into a peripheral hole filled with epoxy.

As illustrated in FIG. 5, bent tapered lead frame fingers provide a larger surface area of contact between each lead frame finger 205 and conductive epoxy 510 deposited in a printed circuit board 515, discussed below. In the illustrative example, the bend may be formed to provide a bent portion, shown as projecting downward 500 approximately 18 mils. More generally, the bend is formed to provide as much projection as possible for greater mechanical strength and surface contact, but not so much that the lead frame finger punctures a dry film 505 which is deposited at the bottom of the printed circuit board, as discussed below. Bending is done in any convenient manner as well known to those of ordinary skill.

Figure 6:
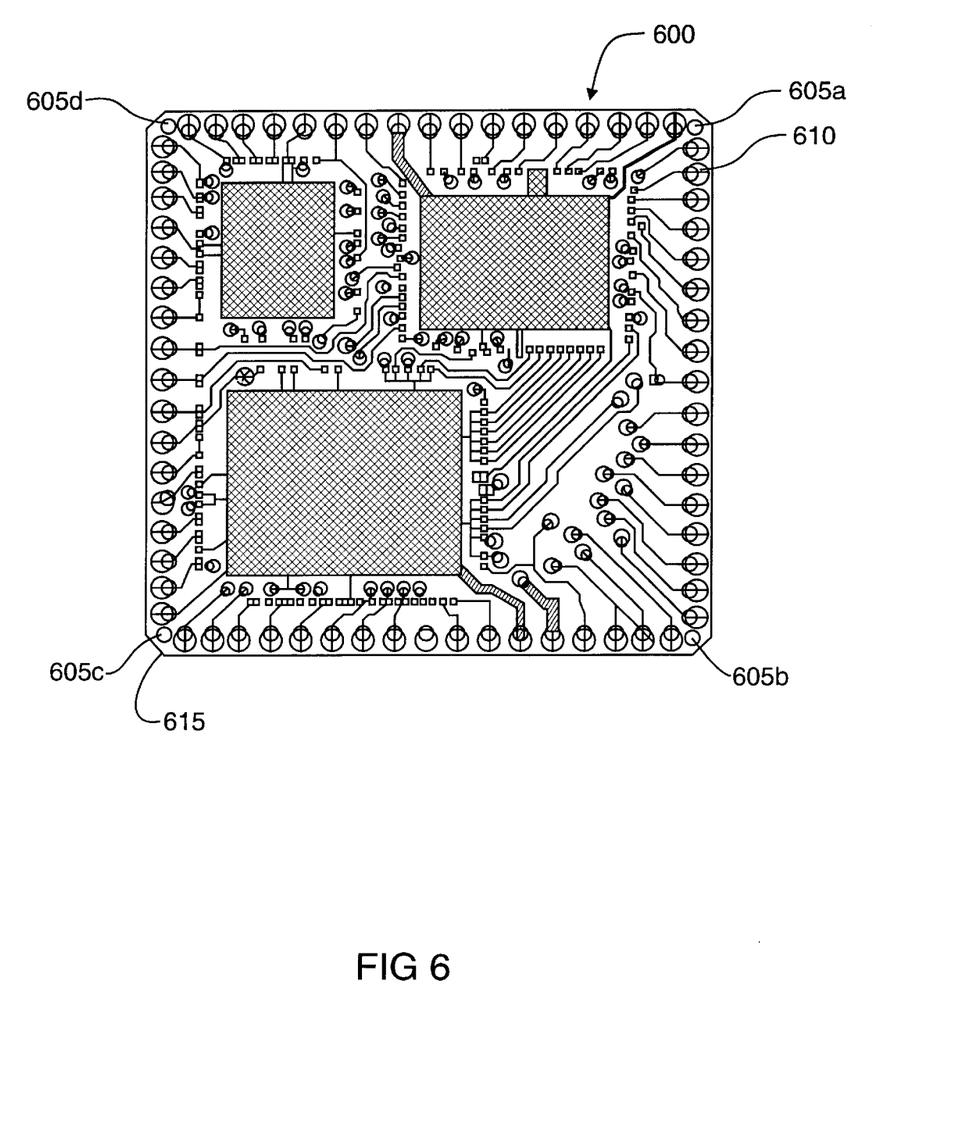
FIG. 6 is a schematic representation of a printed circuit board having locating holes, peripheral holes and chamfered corners.

Referring to FIG. 6, a specially-designed printed circuit board 600 may be made. The printed circuit board 600 includes a plurality of locating holes 605a–605d specific to the assembly being built; a plurality of peripheral holes 610; a plurality of non-pointed corners 615; a silver or gold final plating; and a dry film beneath at least the peripheral holes.

Each of the plurality of locating holes 605a–605d may be located at the periphery of the printed circuit board 600. Placing the locating holes in the corners of the printed circuit board 600 has been found to work satisfactorily. Additionally, locating holes 605a–605d need not be plated or tented as they are not used in a conductive capacity, but are instead used to help situate the printed circuit board 600 with respect to the lead frame during assembly. Use of locating holes 605a–605d may reduce assembly time and error. These locating holes 605a–605d are made in any convenient manner as is well known to those of ordinary skill.

The printed circuit board 600 includes a plurality of peripheral holes 610 about its periphery. Peripheral holes 610 are made in any convenient manner as well known to those of ordinary skill. In the present invention, the number of peripheral holes 610 may match the number of lead frame fingers of the lead frame. The peripheral holes 610 may be plated through with, e.g., gold or silver. Plating is done in any convenient manner as well known to those of ordinary skill.

The peripheral holes 610 may be filled with conductive epoxy material such as Epotec E-111 epoxy manufactured by Epoxy Technology Co. in Bilmerica, Mass. The use of conductive epoxy is described for purposes of illustration. It is useful to use a rapid-cure epoxy to reduce the chance of bleeding and resulting shorts between lead fingers. The amount of—conductive epoxy used to fill each of the peripheral holes 610 may be between about $2 \times 10^{-4}$ gms and $4 \times 10^{-4}$ gms, depending upon the diameter of the peripheral hole 610 and the thickness of the printed circuit board 600, as well known to those of ordinary skill. The conductive epoxy serves to conductively connect the bent tapered lead frame fingers to the printed circuit board by fixing each bent tapered lead frame finger in its respective corresponding peripheral hole 610. Filling of the peripheral holes 610 with epoxy is accomplished in any manner well known to those of ordinary skill. Other media or joining techniques known to those of ordinary skill may be used to provide a conductive path between the leads of the chip and the lead frame, e.g., solder paste, copper pellet slurries, spark welding, or laser welding.

As shown in FIG. 6, the corners of the printed circuit board 615 may be chamfered, i.e., trimmed or otherwise formed to have non-pointed corners; this helps reduce undesired stress during assembly, which can lead to cracking of parts.

For final plating of the printed circuit board 615, silver or gold may be used. If gold is used to plate the printed circuit board 615, gold over nickel may be used to plate copper traces and plated-through holes such as the peripheral holes 610 described above. On the other hand, if silver is used to plate the printed circuit board 615, silver over copper may be used to plate copper traces and plated-through holes such as the peripheral holes 610 described above. In the illustrative example, silver is used for final plating, in contrast to the usual industry practice of using gold. Hence, silver over copper may be used to plate copper traces and peripheral holes 610. Once again, plating may be effected in any convenient manner as well known to those of ordinary skill.

The peripheral holes 610 in the printed circuit board 600 are tented, i.e., covered, with a dry film material such as the VACRON family manufactured by duPont. The dry film may be between about 1 mil and about 3.5 mils thick, depending on the thickness of the traces and other aspects of the printed circuit board design, as well known to those of ordinary skill. The dry film serves to prevent conductive epoxy from flowing through the peripheral holes and possibly creating a short between bent tapered lead frame fingers in different peripheral holes 610.

The printed circuit board 600 of the present invention is otherwise conventional; for example, it may be formed using any convenient material (e.g., teflon, polyamide, kapton) in single or multiple layers.

In accordance with the present invention, the lead frame and the printed circuit board described above may be assembled to form a board-frame-epoxy module. A conventional electronic assembler may be used to assemble the lead frame and the printed circuit board in a convenient manner as known to those of ordinary skill. Alternatively, a subcontractor may be hired to perform the assembly.

Figure 7:
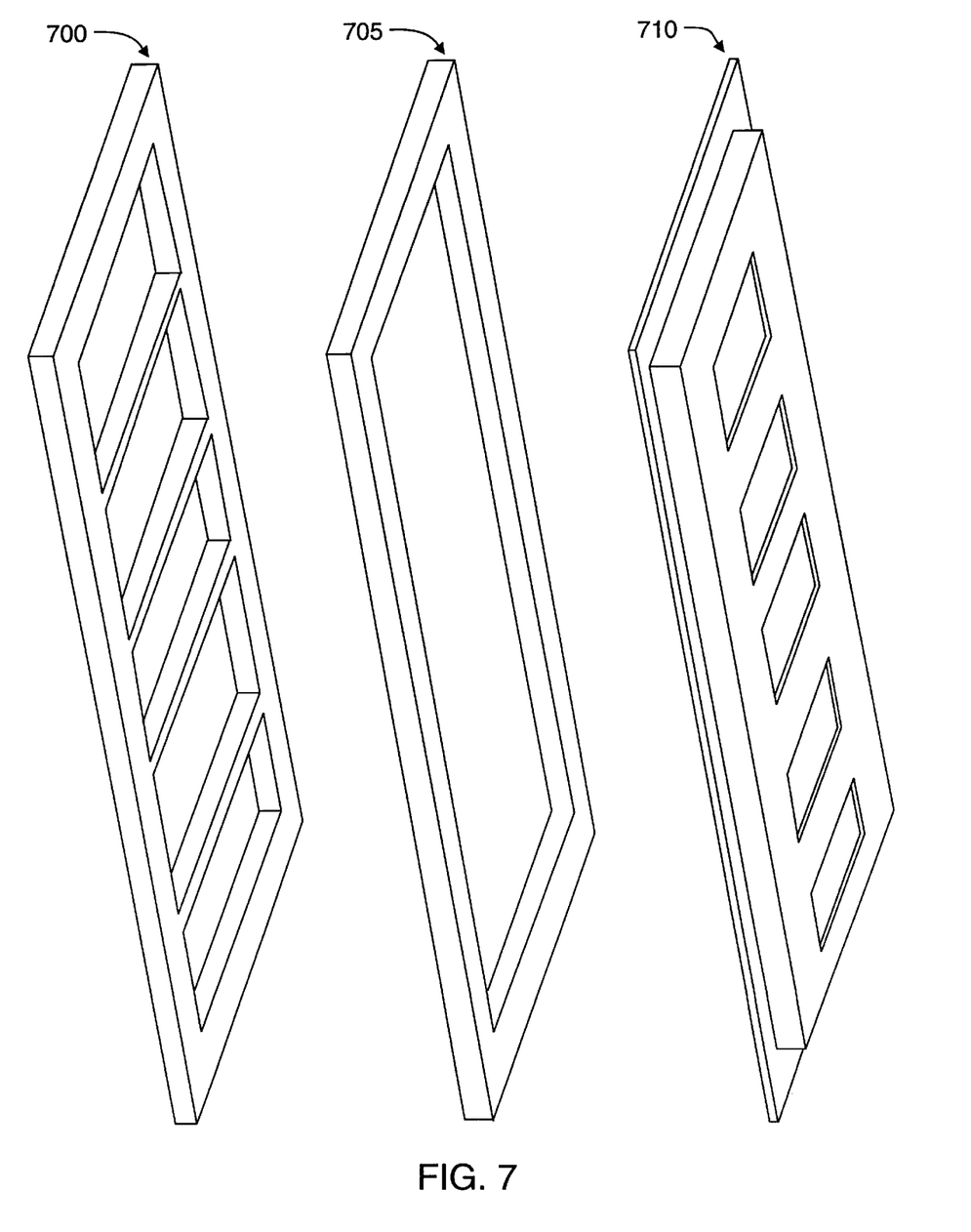
FIG. 7 is a block diagram showing the fixture assembly components.

Assembly may be effected by using a special fixture shown in FIG. 7. The assembly fixture of FIG. 7 has three components: a weighted component 700, a frame holder component 705, and a printed circuit board support component 710. Each of the components of the special fixture may be made in a conventional manner as known to those of ordinary skill. Each component may be formed of a conventional material. Additionally, each component may be formed of the same conventional material such that each component has similar thermal coefficients of expansion. In the illustrative example, each of the weighted component 700, the frame holder component 705 and the printed circuit board support component 710 may be made of copper.

During assembly of the special fixture shown in FIG. 7, the frame holder component 705 may accommodate the lead frame. Additionally, the frame holder component 705 may be formed having a central cavity. The frame holder component 705 may be of the same size and pitch as the lead frame. The lead frame and frame holder component 705 may be assembled such that the lead frame fingers of the lead frame protrude downward in relation to the frame holder component 705. The lead frame and frame holder component 705 may be assembled in a convenient manner as known to those of ordinary skill.

The printed circuit board component 710 may include a plurality of cavities to accommodate a number of printed circuit boards. In the present invention, the number of cavities may match the number of printed circuit boards. The maximum number of printed circuit boards that a printed circuit board component 710 may accommodate may be determined by selection of assembly capabilities as is known to those of ordinary skill. The cavities are made in any convenient manner as well known to those of ordinary skill.

Assembly of a board-frame-epoxy module may include the steps of cleaning and preparing the weighted component 700, the frame holder component 705, and the printed circuit board support component 710; loading one or more printed circuit boards onto the printed circuit board support component 710; loading the printed circuit board support component 710 loaded with one or more printed circuit boards into a machine for depositing conductive epoxy into selected peripheral holes; depositing epoxy into selected peripheral holes; removing the printed circuit board support component 710 loaded with one or more printed circuit boards from the epoxy depositing machine; loading the lead frame into the frame holder component 705; assembling the special assembly fixture so that, in a sandwich-like fashion, the printed circuit board support component 710 loaded with one or more printed circuit boards is at the bottom, the frame holder component 705 loaded with the lead frame is in the middle, the weighted component 700 is at the top; curing the board-frame-epoxy module in an oven; mounting the board-frame-epoxy module to a final device; and encapsulating the final device to form a multi-chip module.

Cleaning and preparing of the assembly fixture components may be accomplished by using any convenient method as well known to those of ordinary skill.

Figure 8:
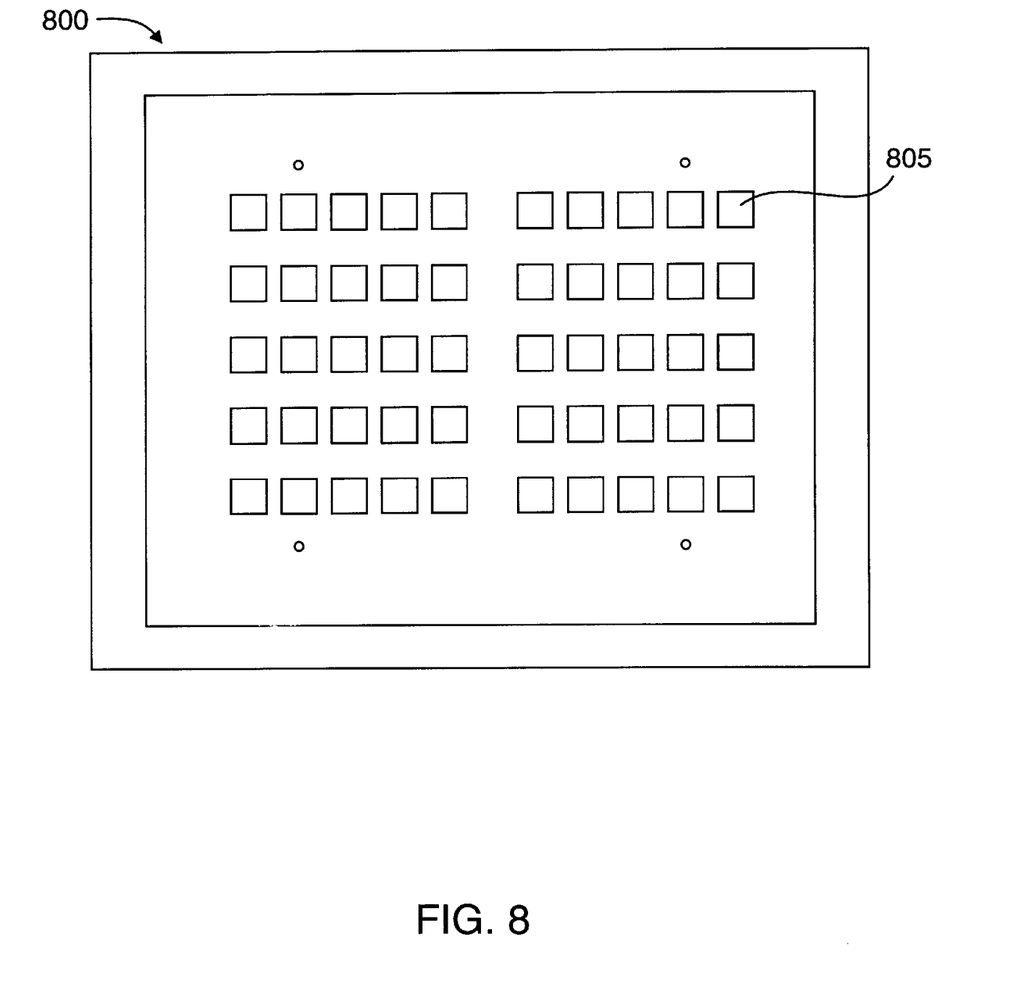
FIG. 8 is a block diagram of a mask used for depositing epoxy.

Depositing of epoxy in selected holes may be accomplished by using a screen such as screen 800 shown in FIG. 8. The screen 800 includes a plurality of holes 805 wherein epoxy may be deposited into holes in the printed circuit board. The screen 800 may be used to select which holes on the printed circuit board are to have epoxy deposited therein. Such selection may be effected by depositing epoxy in the holes 815 which correspond to the holes on the printed circuit board into which it is desired that epoxy should be deposited. Such depositing may be effected by any convenient method as well known to those of ordinary skill. Stenciling and dispensing have been found to work satisfactorily. Mounting and encapsulating may be effected by any convenient method that does not require wirebonding as well known to those of ordinary skill.

The direct attach method of the present invention permits one or more high speed devices, such as devices operating at clock rates measured in giga hertz, to be assembled without capacitance, inductance or high resistance, which are problems caused when bonding wires are used. Additionally, the method of this invention permits assembly of a device having the physical and mechanical characteristics of a standard device commonly sold today. By eliminating bonding wires to connect the printed circuit board to the lead frame, the present invention permits higher assembly yields. It permits cost savings by eliminating assembly steps required for bonding wires, increasing production and replacing gold wire with silver conductive epoxy.

It also permits increased useful printed circuit board area because it permits chip assembly on both sides of a printed circuit board.

Although the invention has been described in its preferred form with a certain degree of particularity, it is understood that the present disclosure has been made only by way of example. Numerous changes in the details and construction of the combination and arrangement of parts will be apparent without departing from the spirit and the scope of the invention.

What is claimed is:

1. A method of manufacturing a multi-chip module, comprising the steps of:

Manufacturing a plurality of chips using a direct attach method;

providing a special-design printed circuit board (PCB) having a plurality of tapered peripheral holes therethrough, the PCB having a thickness;

providing a lead frame having a plurality of tapered lead frame fingers and a central cavity, each of the fingers having a bend therein near an end thereof so that a bent end portion has a length less than or equal to the thickness of the PCB;

positioning a dry film material beneath the peripheral holes;

utilizing a conductive epoxy to fix the leads in the holes of the PCB; and encapsulating the multi-chip module.

2. The method of claim 1, wherein said lead frame fingers are bent with respect to the plane of the lead frame.

3. The method of claim 1 wherein said lead frame fingers are tapered at an angle of about 45 degress.

4. The method of claim 2, wherein said tapered lead fingers are bent at an angle of about 90 degrees.

5. The method of claim 2, wherein the PCB is a multi-layer board.

6. The method of claim 1, wherein the steps of positioning and utilizing comprise steps including:

providing a support component assembly fixture;

providing a frameholder component assembly fixture;

providing a weighted component;

cleaning and preparing the component and frameholder assembly fixtures;

loading the PCB into the support component assembly fixture; loading the support component assembly fixture housing the PCB into a dispensing machine; dispensing epoxy into selected peripheral holes of the PCB; removing the support component—PCB assembly from the dispensing machine; loading the support component—PCB assembly into the frameholder component assembly fixture; assembling the support component—PCB assembly—frameholder component with the weighted component to form a single frame board-epoxy-weight assembly, and curing frameboard-epoxy-weight assembly in an oven.

7. A method of manufacturing a multi-chip module, comprising the steps of:

manufacturing a plurality of chips using a direct attach method;

providing a printed circuit board (PCB) wherein said PCB comprises:

(a) A plurality of locating holes specific to the assembly being built, each locating hole used to align the lead frame with the PCB;

(b) a plurality of peripheral holes adapted to receive a corresponding lead frame finger wherein the corresponding lead frame finger is identified by aligning the locating holes;

(c) non-pointed corners for facilitating assembly;

(d) a silver or gold final plating of the assembly to provide conductance and prevent corrosion;

(e) a dry film beneath at least the peripheral holes;

manufacturing a lead frame with special design features for accommodating the PCB; and assembling the lead frame and the PCB utilizing a conductive epoxy.

* * * * *